(12) United States Patent
Moore et al.

(10) Patent No.: US 8,057,654 B2
(45) Date of Patent: Nov. 15, 2011

(54) ELECTRODEPOSITION OF DIELECTRIC COATINGS ON SEMICONDUCTIVE SUBSTRATES

(75) Inventors: Kelly L. Moore, Dunbar, PA (US); Michael J. Pawlik, Glenshaw, PA (US); Michael G. Sandala, Pittsburgh, PA (US); Craig A. Wilson, Allison Park, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 345 days.

(21) Appl. No.: 12/405,299

(22) Filed: Mar. 17, 2009

(65) Prior Publication Data
US 2009/0236231 A1 Sep. 24, 2009

Related U.S. Application Data

(60) Provisional application No. 61/037,814, filed on Mar. 19, 2008.

(51) Int. Cl.
*C25D 13/04* (2006.01)
*C25D 9/02* (2006.01)
*C25D 7/12* (2006.01)

(52) U.S. Cl. ......... 204/471; 205/157; 205/317; 204/500
(58) Field of Classification Search ............. 204/501, 204/504, 509, 492, 493
See application file for complete search history.

(56) References Cited

U.S. PATENT DOCUMENTS

| 3,455,806 A | 7/1969 | Spoor et al. |
| 3,663,389 A | 5/1972 | Koral et al. |
| 3,749,657 A | 7/1973 | Le Bras et al. |
| 3,793,278 A | 2/1974 | De Bona |
| 3,928,157 A | 12/1975 | Suematsu et al. |
| 3,947,338 A | 3/1976 | Jerabek et al. |
| 3,947,339 A | 3/1976 | Jerabek et al. |
| 3,962,165 A | 6/1976 | Bosso et al. |

(Continued)

FOREIGN PATENT DOCUMENTS

EP 0012463 A1 6/1980

OTHER PUBLICATIONS

Kohler, E. P., "An Apparatus for Determining Both the Quantity of Gas Evolved and the Amount of Reagent Consumed in Reactions with Methyl Magnesium Iodide", J. Am. Chem. Soc., 1927, 49 (12), 3181-3188, American Chemical Society, Washington, D.C.

*Primary Examiner* — Alexa Neckel
*Assistant Examiner* — Brian Cohen
(74) *Attorney, Agent, or Firm* — Robert P. Lenart

(57) ABSTRACT

A method includes: immersing a semiconductive substrate in an electrodeposition composition, wherein at least 20 percent by weight of resin solids in the composition is a highly cross-linked microgel component, and applying a voltage between the substrate and the composition to form a dielectric coating on the substrate. A composition for use in electrodeposition includes a resin blend, a coalescing solvent, a catalyst, water, and a highly cross-linked migrogel, wherein at least 20 percent by weight of resin solids in the composition is the highly cross-linked microgel. Another composition for use in electrodeposition includes a surfactant blend, a low ion polyol, phenoxypropanol, a catalyst, water, a flexibilizer, and a highly cross-linked migrogel, wherein at least 20 percent by weight of resin solids in the composition is the highly cross-linked microgel.

21 Claims, 2 Drawing Sheets

U.S. PATENT DOCUMENTS

| | | |
|---|---|---|
| 3,975,346 A | 8/1976 | Bosso et al. |
| 3,984,299 A | 10/1976 | Jerabek |
| 3,984,922 A | 10/1976 | Rosen |
| 4,001,101 A | 1/1977 | Bosso et al. |
| 4,116,900 A | 9/1978 | Belanger |
| 4,134,932 A | 1/1979 | Kempter et al. |
| 5,096,556 A | 3/1992 | Corrigan et al. |
| 5,371,120 A * | 12/1994 | Uhlianuk ............... 523/414 |
| 6,165,338 A | 12/2000 | December et al. |
| 7,674,846 B2 * | 3/2010 | Chung et al. ............. 523/415 |
| 2006/0141143 A1 | 6/2006 | McCollum et al. |

\* cited by examiner

ELECTRODEPOSITION OF DIELECTRIC COATINGS ON SEMICONDUCTIVE SUBSTRATES

CROSS-REFERENCE TO A RELATED APPLICATION

This application claims the benefit of U.S. Provisional Patent Application Ser. No. 61/037,814, filed Mar. 19, 2008, and titled "Electrodeposition Of Dielectric Coatings On Semiconductive Materials", which is hereby incorporated by reference.

FIELD OF THE INVENTION

The present invention relates to methods and compositions for coating semiconductive materials.

BACKGROUND OF THE INVENTION

Various electronic devices are constructed of semiconductive materials. In the fabrication of such devices, insulating materials, such as dielectric materials, may be formed on surfaces of the semiconductive materials.

Dielectric coatings can be applied using electrodeposition (ED). During aqueous electrodeposition, electricity flows through the material being coated (electrode) and attracts charged particles which are dispersed in the electrodeposition bath. At the surface of the material being coated, electrolysis of water occurs. If the material being coated is serving as the anode, protons are formed at the surface which will then react with negatively charged coating particles (anodic ED). If the material being coated is serving as the cathode, hydroxide ions are formed at the surface which will then react with positively charged coating particles (cathodic ED). If electricity flows easily through the electrode (conductive material), the process is more efficient (i.e., there is more deposited film for a given set of coating conditions) than for a semiconductive or weakly conductive material.

For cathodic ED, the positively charged paint particles are neutralized by the hydroxide ions at the surface, causing the particles to become insoluble in water and collect on the surface of the cathode. The neutralized particles then coalesce into a continuous film on the surface forming an insulating layer. As the insulation increases, electrodeposition gradually decreases and then (eventually) stops.

Electrocoating has the ability to completely coat all kinds of components (inside and out) that conventional spray/brush processes cannot. It also has the potential to coat many different geometries including parts with acute angles, small holes, and sharp edges. Sharp edges have a naturally higher potential to attract charged coating particles than flat surfaces. Thus sharp edges tend to have a higher "wet film" build than the neighboring flat surfaces. However, surface tension effects tend to pull the coating away from the sharp edge(s) during flow/cure. In addition, surface tension varies from substrate to substrate. Higher coating thickness will tend to help ensure that the edges will maintain some coverage. Higher film thicknesses on the sharp edges of conductive substrates can easily be obtained with commercial ED coatings due to the efficient flow of electricity with these substrates. The result is sufficient edge coverage. However, since semiconductive and weakly conductive substrates have greater difficulty building thicker films, these substrates may not obtain sufficient edge coverage with standard E-coats.

There is a need for a conformal dielectric coating that can form an insulating layer that adequately insulates semiconductive materials.

SUMMARY OF THE INVENTION

In a first aspect, the present invention is directed toward a method for depositing a coating on a semiconductive substrate. The method includes: immersing a semiconductive substrate in an electrodeposition composition, wherein at least 20 percent by weight of resin solids in the composition is a highly cross-linked microgel component, and applying a voltage between the substrate and the composition to form a dielectric coating on the substrate.

In another aspect, the invention provides a composition for use in electrodeposition including a resin blend, a coalescing solvent, a catalyst, water, and a highly cross-linked migrogel, wherein at least 20 percent by weight of resin solids in the composition is the highly cross-linked microgel.

In another aspect, the invention provides a composition for use in electrodeposition including a surfactant blend, a low ion polyol, phenoxypropanol, a catalyst, water, a flexibilizer, and a highly cross-linked migrogel, wherein at least 20 percent by weight of resin solids in the composition is the highly cross-linked microgel.

DETAILED DESCRIPTION OF THE INVENTION

Figure 1:
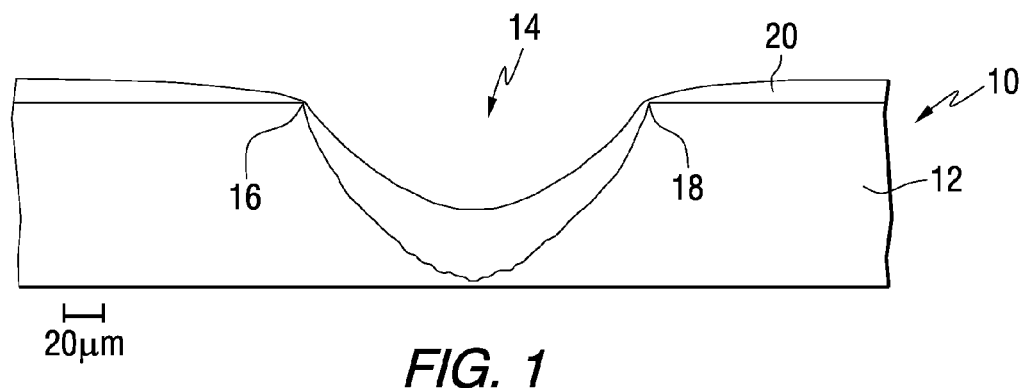
FIGS. 1-6 are schematic representations of substrates coated using the compositions of Examples I-VI.

In one aspect, the present invention is directed to a method for preparing a circuit assembly. The method includes: immersing a semiconductive substrate in an electrodeposition composition, wherein at least 20 percent by weight of resin solids in the composition is a highly cross-linked microgel component, and applying a voltage between the substrate and the composition to form a dielectric coating on the substrate.

The semiconductive material can be, for example, a Group IV elemental semiconductor, a Group IV compound semiconductor, a Group III-V semiconductor, a Group III-V ternary semiconductor alloy, a Group III-V quaternary semiconductor alloy, a Group III-V quinary semiconductor alloy, a Group II-VI semiconductor, a Group II-VI ternary alloy semiconductor, a Group I-VII semiconductor, a Group IV-VI semiconductor, a Group IV-VI ternary semiconductor, a Group V-VI semiconductor, a Group II-V semiconductor, layered semiconductors, or other semiconductors, including organic semiconductors and magnetic semiconductors.

Group IV elemental semiconductors include Diamond (C), Silicon (Si), and Germanium (Ge). Group IV compound semiconductors include Silicon carbide (SiC), and Silicon germanide (SiGe). Group III-V semiconductors include Aluminium antimonide (AlSb), Aluminium arsenide (AlAs), Aluminium nitride (AlN), Aluminium phosphide (AlP), Boron nitride (BN), Boron phosphide (BP), Boron arsenide (BAs), Gallium antimonide (GaSb), Gallium arsenide (GaAs), Gallium nitride (GaN), Gallium phosphide (GaP), Indium antimonide (InSb), Indium arsenide (InAs), Indium nitride (InN), and Indium phosphide (InP). Group III-V ternary semiconductor alloys include Aluminium gallium arsenide (AlGaAs, $Al_xGa_{1-x}As$), Indium gallium arsenide (InGaAs, $In_xGa_{1-x}As$), Indium gallium phosphide (InGaP), Aluminium indium arsenide (AlInAs), Aluminium indium antimonide (AlInSb), Gallium arsenide nitride (GaAsN), Gallium arsenide phosphide (GaAsP), Aluminium gallium nitride (AlGaN), Aluminium gallium phosphide (AlGaP), Indium gallium nitride (InGaN), Indium arsenide antimonide (InAsSb), and Indium gallium antimonide (InGaSb).

Group III-V quaternary semiconductor alloys include Aluminium gallium indium phosphide (AlGaInP, also InAlGaP, InGaAlP, AlInGaP), Aluminium gallium arsenide phosphide (AlGaAsP), Indium gallium arsenide phosphide (InGaAsP), Aluminium indium arsenide phosphide (AlInAsP), Aluminium gallium arsenide nitride (AlGaAsN), Indium gallium arsenide nitride (InGaAsN), and Indium aluminium arsenide nitride (InAlAsN).

Group III-V quinary semiconductor alloys include Gallium indium nitride arsenide antimonide (GaInNAsSb).

Group II-VI semiconductors include Cadmium selenide (CdSe), Cadmium sulfide (CdS), Cadmium telluride (CdTe), Zinc oxide (ZnO), Zinc selenide (ZnSe), Zinc sulfide (ZnS), and Zinc telluride (ZnTe).

Group II-VI ternary alloy semiconductors include Cadmium zinc telluride (CdZnTe, CZT), Mercury cadmium telluride (HgCdTe), Mercury zinc telluride (HgZnTe), and Mercury zinc selenide (HgZnSe).

Group I-VII semiconductors include Cuprous chloride (CuCl).

Group V-VI semiconductors include Lead selenide (PbSe), Lead sulfide (PbS), Lead telluride (PbTe), Tin sulfide (SnS), and Tin telluride (SnTe).

Group IV-VI ternary semiconductors include lead tin telluride (PbSnTe), Thallium tin telluride ($Tl_2SnTe_5$), and Thallium germanium telluride ($Tl_2GeTe_5$).

Group V-VI semiconductors include Bismuth telluride ($Bi_2Te_3$).

Group II-V semiconductors include Cadmium phosphide ($Cd_3P_2$), Cadmium arsenide ($Cd_3As_2$), Cadmium antimonide ($Cd_3Sb_2$), Zinc phosphide ($Zn_3P_2$), Zinc arsenide ($Zn_3As_2$), and Zinc antimonide ($Zn_3Sb_2$).

Layered semiconductors include Lead (II) iodide ($PbI_2$), Molybdenum disulfide ($MoS_2$), Gallium selenide (GaSe), Tin sulfide (SnS), and Bismuth sulfide ($Bi_2S_3$).

Other semiconductors include Copper indium gallium selenide (CIGS), Platinum silicide (PtSi), Bismuth (III) iodide ($BiI_3$), Mercury (II) iodide ($HgI_2$), and Thallium (I) bromide (TlBr).

Miscellaneous semiconductive oxides include Titanium dioxide: anatase ($TiO_2$), Copper(I) oxide ($Cu_2O$), Copper(II) oxide (CuO), Uranium dioxide ($UO_2$), and Uranium trioxide ($UO_3$).

In one embodiment of the present invention, the substrate has a surface resistivity of $<1\times10^{12}$ ohms/sq and a bulk resistivity of <20 Mohms.

The material compositions provide improved edge coverage. These materials have a lower tendency to flow, and are able to effectively resist surface tension and remain in place. The use of a highly cross-linked microgel material enhances the flow restriction property.

Curable coating compositions can comprise as a main film-former, an ungelled, active hydrogen-containing resin (i). Examples of such coatings are described in U.S. Patent Application Publication No. 2006/0141143 A1, which is hereby incorporated by reference.

A wide variety of film-forming polymers are known and can be used in the curable coating compositions, provided they comprise active hydrogen groups, as determined by the Zerewitinoff test, described in the JOURNAL OF THE AMERICAN CHEMICAL SOCIETY, Vol. 49, page 3181 (1927). In one embodiment, the active hydrogens are derived from hydroxyl groups, thiol groups, primary amine groups and/or secondary amine groups.

By "ungelled" is meant the resins are substantially free of crosslinking and have an intrinsic viscosity when dissolved in a suitable solvent, as determined, for example, in accordance with ASTM-D1795 or ASTM-D4243. The intrinsic viscosity of the reaction product is an indication of its molecular weight. A gelled reaction product, on the other hand, since it is of essentially infinitely high molecular weight, will have an intrinsic viscosity too high to measure. As used herein, a reaction product that is "substantially free of crosslinking" refers to a reaction product that has a weight average molecular weight (Mw), as determined by gel permeation chromatography, of less than 1,000,000.

A variety of active hydrogen-containing resin materials are suitable for use in embodiments of the present invention. Non-limiting examples of suitable resins include: polyepoxide polymers, acrylic polymers, polyester polymers, urethane polymers, silicon-based polymers; polyether polymers, polyurea polymers, vinyl polymers, polyamide polymers, polyimide polymers, mixtures thereof and copolymers thereof. As used herein, by "silicon-based polymers" is meant a polymer comprising one or more —SiO— units in the backbone. Such silicon-based polymers can include hybrid polymers, such as those comprising organic polymeric blocks with one or more —SiO— units in the backbone.

The polymer is typically a water-dispersible, electrodepositable film-forming polymer. The water-dispersible polymer may be ionic in nature; that is, the polymer can contain anionic functional groups to impart a negative charge or cationic functional groups to impart a positive charge. Most often, the polymer contains cationic salt groups, usually cationic amine salt groups.

Non-limiting examples of film-forming resins suitable for use as the polymer in the composition, in particular in anionic electrodepositable coating compositions, include base-solubilized, carboxylic acid group-containing polymers such as the reaction product or adduct of a drying oil or semi-drying fatty acid ester with a dicarboxylic acid or anhydride; and the reaction product of a fatty acid ester, unsaturated acid or anhydride and any additional unsaturated modifying materials which are further reacted with polyol. Also suitable are the at least partially neutralized interpolymers of hydroxy-alkyl esters of unsaturated carboxylic acids, unsaturated carboxylic acid and at least one other ethylenically unsaturated monomer. Still another suitable electrodepositable resin comprises an alkyd-aminoplast vehicle, i.e., a vehicle containing an alkyd resin and an amine-aldehyde resin. Another suitable anionic electrodepositable resin composition comprises mixed esters of a resinous polyol. These compositions are described in detail in U.S. Pat. No. 3,749,657 at col. 9, lines 1 to 75 and col. 10, lines 1 to 13. Other acid functional polymers also can be used such as phosphatized polyepoxide or phosphatized acrylic polymers as are well known to those skilled in the art. Additionally, suitable for use as the polymer are those resins comprising one or more pendent carbamate functional groups, for example, those described in U.S. Pat. No. 6,165,338.

In one particular embodiment of the present invention, the polymer is a cationic, active hydrogen-containing ionic electrodepositable resin capable of deposition on a cathode. Non-limiting examples of such cationic film-forming resins include amine salt group-containing resins such as the acid-solubilized reaction products of polyepoxides and primary or secondary amines such as those described in U.S. Pat. Nos. 3,663,389; 3,984,299; 3,947,338; and 3,947,339. Besides the epoxy-amine reaction products discussed immediately above, the polymer can also be selected from cationic acrylic resins such as those described in U.S. Pat. Nos. 3,455,806 and 3,928,157.

Besides amine salt group-containing resins, quaternary ammonium salt group-containing resins can also be employed. Examples of these resins include those which are formed from reacting an organic polyepoxide with a tertiary amine salt. Such resins are described in U.S. Pat. Nos. 3,962,165; 3,975,346; and 4,001,101. Examples of other cationic resins are ternary sulfonium salt group-containing resins and quaternary phosphonium salt group-containing resins such as those described in U.S. Pat. Nos. 3,793,278 and 3,984,922, respectively. Also, film-forming resins such as described in European Application No. 12463 can be used. Further, cationic compositions prepared from Mannich bases such as described in U.S. Pat. No. 4,134,932 can be used.

In one embodiment of the present invention, the polymer can comprise one or more positively charged resins which contain primary and/or secondary amine groups. Such resins are described in U.S. Pat. Nos. 3,663,389; 3,947,339; and 4,116,900. In U.S. Pat. No. 3,947,339, a polyketimine derivative of a polyamine such as diethylenetriamine or triethylenetetraamine is reacted with a polyepoxide. When the reaction product is neutralized with acid and dispersed in water, free primary amine groups are generated. Also, equivalent products are formed when a polyepoxide is reacted with excess polyamines such as diethylenetriamine and triethylenetetraamine and the excess polyamine vacuum stripped from the reaction mixture. Such products are described in U.S. Pat. Nos. 3,663,389 and 4,116,900.

Mixtures of the above-described ionic resins also can be used advantageously. In one embodiment of the present invention, the polymer has cationic salt groups and is selected from a polyepoxide-based polymer having primary, secondary and/or tertiary amine groups (such as those described above) and an acrylic polymer having hydroxyl and/or amine functional groups.

As previously discussed, in one particular embodiment of the present invention, the polymer has cationic salt groups. In this instance, such cationic salt groups typically are formed by solubilizing the resin with an inorganic or organic acid such as those conventionally used in electrodepositable compositions. Suitable examples of solubilizing acids include, but are not limited to, sulfamic, acetic, lactic, and formic acids. In an embodiment of the invention the solubilizing acid comprises sulfamic acid and/or lactic acid.

In a particular embodiment, the coating compositions useful in the methods of the present invention comprise one or more components comprising covalently bonded halogen atoms. It should be understood that for purposes of the present invention, by "covalently bonded halogen atom" is meant a halogen atom that is covalently bonded as opposed to a halogen ion, for example, a chloride ion in aqueous solution.

The coating composition can have a covalently bonded halogen content of at least 1 weight percent, or at least 2 weight percent, or at least 5 weight percent, or at least 10 weight percent, based on total weight of resin solids. Also, the coating composition can have a covalently bonded halogen content of less than or equal to 50 weight percent, or less than or equal to 30 weight percent, or less or equal to 25 weight percent, or less than or equal to 20 weight percent. The coating composition can have a covalently bonded halogen content which can range between any combination of these values, inclusive of the recited values.

In an embodiment of the present invention, the coating composition is an electrodepositable coating composition comprising a resinous phase dispersed in an aqueous medium. The covalently bonded halogen content of the resinous phase of the electrodepositable coating composition can be derived from halogen atoms covalently bonded to the resin (i). In such instances, the covalently bonded halogen content can be attributed to a reactant used to form any of the film-forming resins described above. For example, the resin may be the reaction product of a halogenated phenol, for example a halogenated polyhydric phenol such as chlorinated or brominated bisphenol A with an epoxy group-containing material such as those described above with reference to the resin (i). In the case of an anionic group-containing polymer, solubilization with phosphoric acid may follow. Alternatively, an epoxy containing compound reacted with a halogenated carboxylic acid followed by reaction of any residual epoxy groups with phosphoric acid would yield a suitable polymer. The acid groups can then be solubilized with amine. Likewise, in the case of a cationic salt group-containing polymer, the resin may be the reaction product of an epoxy functional material such as those described above with a halogenated phenol followed by reaction of any residual epoxy groups with an amine. The reaction product can then be solubilized with an acid.

In one embodiment of the present invention, the covalently bonded halogen content of the resin (i) can be derived from a halogenated compound selected from at least one of a halogenated phenol, halogenated polyepoxide, halogenated acrylic polymer, halogenated polyolefin, halogenated phosphate ester, and mixtures thereof. In another embodiment of the present invention, the covalently bonded halogen content of the resin (i) is derived from a halogenated polyhydric phenol, for example, a chlorinated bisphenol A such as tetrachlorobisphenol A, or a brominated bisphenol A such as tetrabromobisphenol A. Additionally, the covalently bonded halogen content may be derived from a halogenated epoxy compound, for example, the diglycidyl ether of a halogenated bisphenol A.

The active hydrogen-containing resin (i) described above can be present in the curable coating composition in amounts ranging from 10 to 90 percent by weight, or 30 to 45 percent by weight based on total weight of the curable coating composition.

As previously discussed, the composition can further comprise one or more polyester curing agents (ii). The polyester curing agent (ii) is a material having greater than one ester group per molecule. The ester groups are present in an amount sufficient to effect cross-linking at acceptable cure temperatures and cure times, for example at temperatures up to 250° C., and curing times of up to 90 minutes. It should be understood that acceptable cure temperatures and cure times will be dependent upon the substrates to be coated and their end uses.

Compounds generally suitable as the polyester curing agent (ii) are polyesters of polycarboxylic acids. Non-limiting examples include bis(2-hydroxyalkyl)esters of dicarboxylic acids, such as bis(2-hydroxybutyl)azelate and bis(2-hydroxyethyl)terephthalate; tri(2-ethylhexanoyl)trimellitate; and poly(2-hydroxyalkyl)esters of acidic half-esters prepared from a dicarboxylic acid anhydride and an alcohol, including polyhydric alcohols. The latter type is particularly suitable to provide a polyester with a final functionality of more than 2. One suitable example includes a polyester prepared by first reacting equivalent amounts of the dicarboxylic acid anhydride (for example, succinic anhydride or phthalic anhydride) with a trihydric or tetrahydric alcohol, such as glycerol, trimethylolpropane or pentaerythritol, at temperatures below 150° C., and then reacting the acidic polyester with at least an equivalent amount of an epoxy alkane, such as 1,2-epoxy butane, ethylene oxide, or propylene oxide. The polyester curing agent (ii) can comprise an anhydride. Another suitable polyester comprises a lower 2-hydroxy-alkylterminated poly-alkyleneglycol terephthalate.

In a particular embodiment, the polyester comprises at least one ester group per molecule in which the carbon atom adjacent to the esterified hydroxyl has a free hydroxyl group.

Also suitable is the tetrafunctional polyester prepared from the half-ester intermediate prepared by reacting trimellitic anhydride and propylene glycol (molar ratio 2:1), then reacting the intermediate with 1,2-epoxy butane and the glycidyl ester of branched monocarboxylic acids.

In one particular embodiment, where the active hydrogen-containing resin (i) comprises cationic salt groups, the polyester curing agent (ii) is substantially free of acid. For purposes of the present description, by "substantially free of acid" is meant having less than 0.2 meq/g acid. For aqueous systems, for example for cathodic electrodepositable, coating compositions, suitable polyester curing agents can include non-acidic polyesters prepared from a polycarboxylic acid anhydride, one or more glycols, alcohols, glycol monoethers, polyols, and/or monoepoxides.

Suitable polycarboxylic anhydrides can include dicarboxylic acid anhydrides, such as succinic anhydride, phthalic anhydride, tetrahydrophthalic anhydride, trimellitic anhydride, hexahydrophthalic anhydride, methylhexahydrophthalic anhydride, 3,3',4,4'-benzophenonetetracarboxylic dianhydride, and pyromellitic dianhydride. Mixtures of anhydrides can be used.

Suitable alcohols can include linear, cyclic or branched alcohols. The alcohols may be aliphatic, aromatic or araliphatic in nature. As used herein, the terms glycols and mono-epoxides are intended to include compounds containing not more than two alcohol groups per molecule which can be reacted with carboxylic acid or anhydride functions below the temperature of 150° C.

Suitable mono-epoxides can include glycidyl esters of branched monocarboxylic acids. Further, alkylene oxides, such as ethylene oxide or propylene oxide may be used. Suitable glycols can include, for example ethylene glycol and polyethylene glycols, propylene glycol and polypropylene glycols, and 1,6-hexanediol. Mixtures of glycols may be used.

Non-acidic polyesters can be prepared, for example, by reacting, in one or more steps, trimellitic anhydride (TMA) with glycidyl esters of branched monocarboxylic acids in a molar ratio of 1:1.5 to 1:3, if desired with the aid of an esterification catalyst such as stannous octoate or benzyl dimethyl amine, at temperatures of 50-150° C. Additionally, trimellitic anhydride can be reacted with 3 molar equivalents of a monoalcohol such as 2-ethylhexanol.

Alternatively, trimellitic anhydride (1 mol.) can be reacted first with a glycol or a glycol monoalkyl ether, such as ethylene glycol monobutyl ether in a molar ratio of 1:0.5 to 1:1, after which the product is allowed to react with 2 moles of glycidyl esters of branched monocarboxylic acids. Furthermore, the polycarboxylic acid anhydride i.e., those containing two or three carboxyl functions per molecule or a mixture of polycarboxylic acid anhydrides can be reacted simultaneously with a glycol, such as 1,6-hexane diol and/or glycol mono-ether and monoepoxide, after which the product can be reacted with mono-epoxides, if desired. For aqueous compositions these non-acid polyesters can also be modified with polyamines such as diethylene triamine to form amide polyesters. Such "amine-modified" polyesters may be incorporated in the linear or branched amine adducts described above to form self-curing amine adduct esters.

The non-acidic polyesters of the types described above typically are soluble in organic solvents, and typically can be mixed readily with the active hydrogen-containing resin (i) previously described.

Polyesters suitable for use in an aqueous system or mixtures of such materials disperse in water typically in the presence of resins comprising cationic or anionic salt groups such as any of those described previously.

A transesterification catalyst (iii) may optionally be present in the compositions. The catalyst (iii) can be any suitable catalyst known for catalysis of the transesterification reaction. In an embodiment of the present invention the catalyst (iii) comprises a metal oxide, metal complex or metal salt.

Suitable metal oxides include, for example, oxides of lead, bismuth, and tin, including dialkyltin oxides such as dioctyltin oxide or dibutyltin oxide. Alternatively, lead oxide and bismuth oxide can also be used when dissolved in an aqueous acid solution for example, an aqueous solution of a sulfonic acid.

Suitable salts may include carboxylate salts (for example, octoates or naphthenates) of lead, zinc, calcium, barium, iron, bismuth and tin, including dialkyltin dicarboxylates. Non-limiting examples of salts include lead octoate, zinc octoate, and dioctyltin formate. A suitable example of a metal complex is titanium acetyl acetonate.

Also suitable are salts e.g., octoates, and naphthenates, of the alkali and earth alkali metals, of the lanthanides, and of zirconium, cadmium, chromium; acetyl acetonate complexes of lead, zinc, cadmium, cerium, thorium, copper; alkali aluminum alcoholates and titanium tetraisopropoxide.

Mixtures of any of the salts, oxides and/or complexes described above can also be used.

In view of the varying metal content of available metal oxides, salts or complexes, or solutions thereof, the amount of catalyst may be indicated by the metal content contained in the compositions. Metal contents of 0.1 to 3.0 percent by weight are suitable, or metal contents of 0.3 to 1.6 percent by weight may be used, based on the total weight of the curable coating composition.

In one aspect, the invention uses a cationic electrodeposition of a microgel dispersion on a semiconductive material. Cationic microgels and their use in electrodeposition are described in U.S. Pat. No. 5,096,556, which is hereby incorporated by reference.

Any of the previously described ionic group-containing compositions can be electrophoretically applied to an electroconductive substrate. The applied voltage for electrodeposition may be varied and can be, for example, as low as 1 volt to as high as several thousand volts, but typically between 50 and 500 volts. The current density is usually between 0.5 ampere and 5 amperes per square foot (0.5 to 5 milliamperes per square centimeter) and tends to decrease during electrodeposition indicating the formation of an insulating conformal film on all exposed surfaces of the core. As used herein and in the specification and in the claims, by "conformal" film or coating is meant a film or coating having a substantially uniform thickness which conforms to the substrate topography, including the surfaces within (but not occluding) any holes that may be present.

After the coating has been applied by an appropriate method, such as those mentioned above, it is cured. The coating can be cured at ambient temperatures or thermally cured at elevated temperatures ranging from 90 to 300° C. for a period of 5 to 90 minutes to form a dielectric coating over the substrate.

The dielectric coating thickness can be no more than 50 microns, or no more than 25 microns, or no more than 20 microns.

Those skilled in the art would recognize that prior to the application of the dielectric coating, the core surface may be pretreated or otherwise prepared for the application of the dielectric coating. For example, cleaning, rinsing, and/or treatment with an adhesion promoter prior to application of the dielectric may be appropriate.

After application of the dielectric coating, the surface of the dielectric coating is optionally ablated in a predetermined pattern to expose sections of the substrate. Such ablation can be performed using a laser or by other conventional techniques, for example, mechanical drilling and chemical or plasma etching techniques.

Illustrating the invention are the following examples which are not to be considered as limiting the invention to their details. Unless otherwise indicated, all parts and percentages in the following examples, as well as throughout the specification, are by weight.

EXAMPLES

The following examples illustrate the preparation of an electrodeposition coating and its use in the method for forming a circuit assembly.

Example 1

The following example describes the synthesis of the cationic binder used in the electrodepositable coating bath described below. The binder was prepared from the following ingredients:

| Ingredients | Parts by Weight (in grams) |
|---|---|
| MAZON 1651[1] | 150.0 |
| EPON 880[2] | 755.3 |
| Tetrabromo bisphenol A | 694.9 |
| TETRONIC 150R1[3] | 0.2857 |
| Aminopropyldiethanolamine | 114.7 |
| Diethanolamine | 49.57 |
| 2-Butoxyethanol | 382 |
| EPON 880 | 48.3 |
| Crosslinker[4] | 1195 |

[1]A plasticizer, commercially available from BASF Corporation.
[2]An epoxy resin available from Hexion Specialty Chemicals.
[3]A surfactant, commercially available from BASF Corporation.
[4]A polyester prepared according to Example V of EP 0 012 463, and diluted to 90% solids in 2-butoxyethanol.

The MAZON 1651, EPON 880, tetrabromobisphenol A and TETRONIC 150R1 were charged to a 4-neck round bottom flask fitted with a stirrer, temperature probe, and Dean-Stark trap under a Nitrogen blanket. The mixture was heated to a temperature of 70° C. and stirred for 15 minutes. The heat source then was removed, and the aminopropyldiethanolamine and diethanolamine were added. The reaction mixture exothermed to a maximum temperature of 176° C. after about 10 minutes. The reaction was allowed to cool to a temperature of 135° C. over an hour, the 2-butoxyethanol was added, and the mixture was further cooled to 125° C. The mixture was then held at 125° C. for a total of two hours from the peak exotherm. The second charge of EPON 880 and the crosslinker were added and the solution was stirred for 2.5 hours at 125° C. The reaction mixture (3428 parts) was poured into a solution of sulfamic acid (49.5 parts) dissolved in deionized water (1287 parts) under strong agitation. After one hour agitation, an additional amount of deionized water (3970 parts) was added slowly, yielding a dispersion having a 30.2% non-volatile content.

Example 2

This example shows the preparation of an ungelled cationic soap used in the synthesis of the microgel example shown below. The cationic soap was prepared from the following ingredients:

| Ingredients | Parts by Weight (in grams) |
|---|---|
| EPON 828 | 1023 |
| Bisphenol A-ethylene oxide adduct[1] | 365 |
| Bisphenol A | 297 |
| 2-Butoxyethanol | 187.2 |
| Benzyldimethylamine | 1.4 |
| Benzyldimethylamine | 3.0 |
| Diketimine[2] | 182.3 |
| N-methylethanolamine | 85.2 |
| Acetic Acid | 105.9 |
| Deionized water | 1065.9 |
| Deionized water | 735.9 |
| Deionized water | 1156.4 |
| Deionized water | 867.3 |

[1]A 1/6 molar adduct of bisphenol A/ethylene oxide available from BASF Surfactants.
[2]A 71 percent solution of the reaction product of diethylene triamine and methylisobutyl ketone in methylisobutyl ketone.

The EPON 828, bisphenol A-ethylene oxide adduct, bisphenol A and 2-butoxyethanol were charged into a reaction vessel and heated under a nitrogen atmosphere to a temperature of 125° C. The first portion of the benzyldimethylamine was added and the reaction was allowed to exotherm to 180° C. During the exotherm when the reaction reached 160° C., a one hour hold was begun. After the exotherm peak the resin was allowed to cool back to 160° C., continuing the hold. After the hold the reaction was cooled to 130° C., and the second portion of benzyldimethylamine was added. The reaction was held at 130° C. to an extrapolated epoxy equivalent weight of 1070. At the expected epoxy equivalent weight, the diketimine and N-methylethanolamine were added in succession and the mixture was allowed to exotherm to approximately 150° C. At the peak exotherm, a one hour hold was begun while allowing the reaction to cool to 125° C. After the one hour hold the resin was dispersed into a solution of the acetic acid dissolved in the first portion of deionized water. The dispersion was later reduced with the second, third, and fourth portions of deionized water. The resulting cationic soap was vacuum stripped until the methylisobutyl ketone level was less than 0.05%.

Example 3

This example shows the synthesis of a cationic microgel from the cationic epoxy soap described above in Example 2. The microgel was prepared from the following ingredients:

| Ingredients | Parts by Weight (in grams) |
|---|---|
| Cationic soap of Example 2 | 2517 |
| Deionized water | 443 |

-continued

| Ingredients | Parts by Weight (in grams) |
|---|---|
| EPON 828 (85% in methylisobutyl ketone) | 66.4 |
| Methylisobutyl ketone | 5.81 |
| Deionized water | 337 |

The deionized water was added to the cationic soap of Example 2, and the mixture was heated to 70° C. under a nitrogen blanket. The EPON 828 solution was added over 15 minutes with good agitation. The methylisobutyl ketone was added as a rinse, and the mixture was held at 70° C. for 45 minutes. The mixture was then heated to 90° C. over 70 minutes and held at this temperature for 3 hours with good mixing. The deionized water was then added and the mixture was cooled yielding a microgel dispersion at 18.9% non-volatile content.

The microgel of Example 3 is referred to herein as a "microgel" or in some instances a "standard microgel".

Example 4

This example shows the synthesis of a highly cross-linked cationic microgel from the cationic epoxy soap described above in Example 2. The highly cross-linked microgel can be prepared from the following ingredients:

| Ingredients | Parts by Weight (in grams) |
|---|---|
| Cationic soap of Example 2 | 2517 |
| Deionized water | 443 |
| EPON 828 (85% in methylisobutyl ketone) | at least 85.4 and preferably 95.0 |
| Methylisobutyl ketone | 5.81 |
| Deionized water | 337 |

The components of Example 4 are mixed and processed in the same manner as the components of Example 3. The microgel of Example 4 is referred to herein as a "highly cross-linked microgel". A highly cross-linked microgel has a greater amount of cross-linking than a standard microgel.

Electrodeposition Coating Bath and Coatings

Example A

This example shows the preparation of a blend used to prepare the coating bath described below in Example C. The blend was prepared from the following ingredients:

| Raw Material | Parts by Weight (in grams) |
|---|---|
| Cationic Epoxy High MW with polyester x-linker (Example 1) | 1023.7 |
| Ethylene Glycol Monohexyl Ether | 34.4 |
| Microgel (Example 3) | 344.3 |
| DI Water | 2037.6 |

The electrodeposition resin of Example 1 was placed in a container under slow agitation. The ethyleneglycol monohexyl ether was added to this resin slowly under agitation and stirred for 30 minutes. The deionized water was then added to this mixture.

Example B

This example shows the preparation of a second blend used to prepare the coating bath described below in Example C. The blend was prepared by adding the following catalyst to the blend of Example A:

| Raw Material | Parts by Weight (in grams) |
|---|---|
| E6278[1] | 13.0 |

[1]Catalyst paste, available from PPG Industries, Inc.

The above ingredients were mixed under low agitation for 30 minutes.

Example C

Example B was repeated. Approximately 1720 grams of permeate was removed from the coating bath via ultrafiltration, the permeate being replaced with deionized water. The final pH and conductivity of the ultrafiltered paint were 5.08 and 566 microsiemens respectively. The measured solids of the tank (1 hour at 110° C.) was 9.43%.

Example D

The electrodepositable coating composition of Example C was electrophoretically applied to silicon substrates from the electrodeposition bath at a temperature of 85° F. for 240 seconds at 0.5 amps. Three samples were coated using voltages of 150, 200 and 250 volts. The coating was then cured for 30 minutes at 240° C.

Additional Electrodeposition Composition Examples

Example I

| Raw Material | % Solids | Total Weight (g) | Actual Solids | Resin Solids | % Resin Solids | Density lbs/gal | Density kg/l | Volume (L) | Total % Solids in Bath | Total % in Bath |
|---|---|---|---|---|---|---|---|---|---|---|
| Resin Blend | 29.5% | #REF! | #REF! | 604.00 | 87.79 | 8.85 | 1.0599 | #REF! | #REF! | #REF! |
| Coalescing Solvent | 0.00% | #REF! | 0.00 | 0.00 | 0.00 | 7.52 | 0.7306 | #REF! | #REF! | #REF! |
| Highly Cross-linked Microgel in Resin | 12.2% | 688.5 | 84.00 | 84.00 | 12.21 | 8.85 | 1.06 | 0.73 | #REF! | #REF! |
| Tin Catalyst | 53.0% | 26.5 | 14.05 | 0.00 | 0.00 | 9.81 | 1 | 0.03 | #REF! | #REF! |
| DI Water | 0.00% | #REF! | 0.00 | 0.00 | 0.00 | 8.35 | 1.00 | #REF! | #REF! | #REF! |
| | | #REF! | #REF! | 688.00 | 100.00 | | | #REF! | #REF! | #REF! |

Example II

| Raw Material | Raw Material Total Solids | Total Weight (g) | Actual Solids | Resin Solids | % Resin Solids | Density lbs/gal | Density kg/l | Volume (L) | Total % Solids in Bath | Total % in Bath |
|---|---|---|---|---|---|---|---|---|---|---|
| Resin Blend | 29.5% | 3557.7 | 1049.52 | 1049.52 | 78.24 | 8.85 | 1.06 | 3.36 | 76.68% | 26.96% |
| Coalescing Solvent | 0.00% | 119.5 | 0.00 | 0.00 | 0.00 | 7.52 | 0.90 | 0.13 | 0.00% | 0.91% |
| Highly Crosslink Microgel in Resin | 12.2% | 1196.4 | 145.96 | 145.96 | 10.88 | 8.85 | 1.06 | 1.13 | 10.66% | 9.07% |
| Tin Catalyst | 53.0% | 51.6 | 27.35 | 0.00 | 0.00 | 9.81 | 1.17 | 0.04 | 2.00% | 0.39% |
| DI Water | 0.00% | 7074.8 | 0.00 | 0.00 | 0.00 | 8.35 | 1.00 | 7.07 | 0.00% | 53.61% |
| Added Highly Crosslinked Microgel | 12.2% | 1196.4 | 145.96 | 145.96 | 10.88 | 8.85 | 1.06 | 1.13 | 10.66% | 9.07% |
| | | 13196.40 | 1368.79 | 1341.44 | 100.00 | | | 12.865 | 100.00% | 100.00% |

Example III

| Raw Material | % Solids | Total Weight | Actual Solids | Resin Solids | % Resin Solids | Density lbs/gal | Density kg/l | Volume (L) | Total % Solids in | Total % in Bath |
|---|---|---|---|---|---|---|---|---|---|---|
| Resin Blend | 29.5% | 3669.0 | 1082.36 | 1082.36 | 70.56 | 8.85 | 1.0599 | 3.89 | 69.15% | 24.72% |
| Coalescing Solvent | 0.00% | 123.3 | 0.00 | 0.00 | 0.00 | 7.52 | 0.7306 | 0.09 | 0.00% | 0.83% |
| Highly Crosslinked Microgel in Resin | 12.2% | 1233.7 | 150.51 | 150.51 | 9.81 | 8.85 | 1.06 | 1.31 | 9.62% | 8.31% |
| Tin Catalyst | 53.0% | 59.0 | 31.27 | 0.00 | 0.00 | 9.81 | 1 | 0.06 | 2.00% | 0.40% |
| DI Water | 0.00% | 7290.0 | 0.00 | 0.00 | 0.00 | 8.35 | 1.00 | 7.29 | 0.00% | 49.12% |
| Added Highly Crosslinked Microgel | 12.2% | 2467.5 | 301.04 | 301.04 | 19.63 | 8.85 | 1.06 | 2.62 | 19.23% | 16.62% |
| | | 14842.5 | 1565.2 | 1533.90 | 100.00 | | | 15.25 | 100.00% | 100.00% |

Example IV

| Raw Material | % Solids | Total Weight (g) | Actual Solids | Resin Solids | % Resin Solids | Total % Solids in Bath | Total % in Bath |
|---|---|---|---|---|---|---|---|
| Surfactant Blend | 63.50% | 9.5 | 6.03 | 6.03 | 0.73 | 0.72% | 0.21% |
| Low Ion Polyol | 100.00% | 27.4 | 27.40 | 27.40 | 3.30 | 3.27% | 0.59% |
| Phenoxypropanol | 0.00% | 27.4 | 0.00 | 0.00 | 0.00 | 0.00% | 0.59% |
| Tin Catalyst | 53.00% | 15.7 | 8.32 | 0.00 | 0.00 | 1.00% | 0.34% |
| DI Water | 0.00% | 2200.0 | 0.00 | 0.00 | 0.00 | 0.00% | 47.65% |
| Flexibilizer | 30.00% | 191.8 | 57.54 | 57.54 | 6.94 | 6.87% | 4.15% |
| Epoxy Urethane Resin Blend | 39.00% | 1683.5 | 656.57 | 656.57 | 79.13 | 78.35% | 36.46% |
| Standard Microgel in Resin | 17.80% | 461.5 | 82.15 | 82.15 | 9.90 | 9.80% | 10.00% |

Example V

| Raw Material | % Solids | Total Weight (g) | Actual Solids | Resin Solids | % Resin Solids | Total % Solids in Bath | Total % in Bath |
|---|---|---|---|---|---|---|---|
| Surfactant Blend | 63.50% | 8.5 | 5.40 | 5.40 | 0.65 | 0.65% | 0.18% |
| Low Ion Polyol | 100.00% | 24.8 | 24.80 | 24.80 | 3.01 | 2.98% | 0.53% |
| Phenoxypropanol | 0.00% | 24.8 | 0.00 | 0.00 | 0.00 | 0.00% | 0.53% |
| Tin Catalyst | 53.00% | 15.8 | 8.37 | 0.00 | 0.00 | 1.00% | 0.34% |
| DI Water | 0.00% | 1832.0 | 0.00 | 0.00 | 0.00 | 0.00% | 39.21% |
| Flexibilizer | 30.00% | 171.6 | 51.48 | 51.48 | 6.24 | 6.18% | 3.67% |
| Epoxy Urethane Resin Blend | 39.00% | 1506.0 | 587.34 | 587.34 | 71.20 | 70.48% | 32.23% |
| Standard Microgel in Resin | 17.80% | 412.7 | 73.46 | 73.46 | 8.90 | 8.82% | 8.83% |
| Added Super Microgel | 12.20% | 676.0 | 82.47 | 82.47 | 10.00 | 9.90% | 14.47% |
| | | 4672.2 | 833.3 | 824.95 | 100.0% | 100.0% | 100.00% |

Example VI

| Raw Material | % Solids | Total Weight (g) | Actual Solids | Resin Solids | % Resin Solids | Total % Solids in Bath | Total % in Bath |
|---|---|---|---|---|---|---|---|
| Surfactant Blend | 63.50% | 6.7 | 4.25 | 4.25 | 0.58 | 0.58% | 0.16% |
| Low Ion Polyol | 100.00% | 19.3 | 19.30 | 19.30 | 2.63 | 2.61% | 0.47% |
| Phenoxypropanol | 0.00% | 19.3 | 0.00 | 0.00 | 0.00 | 0.00% | 0.47% |
| Tin Catalyst | 53.00% | 14.0 | 7.42 | 0.00 | 0.00 | 1.00% | 0.34% |
| DI Water | 0.00% | 1187.0 | 0.00 | 0.00 | 0.00 | 0.00% | 28.95% |
| Flexibilizer | 30.00% | 135.3 | 40.59 | 40.59 | 5.54 | 5.49% | 3.30% |
| Epoxy Urethane Resin Blend | 39.00% | 1187.2 | 463.01 | 463.01 | 63.21 | 62.58% | 28.95% |
| Standard Microgel in Resin | 17.80% | 329.00 | 58.56 | 58.56 | 8.00 | 7.91% | 8.02% |
| Added Super Microgel | 12.20% | 1203.0 | 146.77 | 146.77 | 20.04 | 19.84% | 29.34% |
| | | 4100.8 | 739.9 | 732.48 | 100.0% | 100.0% | 100.0% |

In Examples IV-VI, the Surfactant Blend is 85-XS-139, available from Air Products and Chemicals Inc., the Low Ion Polyol is KP-96-1578, the Coalescing Solvent is hexyl cellsolve, and the flexibilizer is an Epoxy Flexibilizer (FQ 408), European Champ Code WE-43-1330. To produce the flexibilizer, 711 g of DER732 (Aliphatic epoxy resin available from Dow Chemical Co.), and 172g bisphenol A are charged to a suitably equipped 3-liter round-bottomed flask. The mixture is heated to 130° C. and 1.65 g benzyldimethyl amine is added. The reaction mixture is held at 135° C. until the epoxide equivalent weight of the mixture is 1232. 58.8 g of butoxyethanol is added and then the mixture is cooled to 95° C. 184.7 g Jeffamine D400 (Polyoxypropylene diamine available from Huntsman Corp.) is added and the reaction held at 95° C. until the Gardner-Holdt viscosity of a sample of the resin diluted 50% solids in methoxy propanol is "H-J". A mixture of 19.1 g Epon 828 and 3.4 g butoxyethanol is added and the mixture held until the Gardner-Holdt viscosity of a sample of the resin diluted to 50% solids in methoxy propanol is "Q-". 989 g of this resin is poured into a mixture of 1047 g deionized water and 19 g acetic and mixed for 30 minutes. 1030 g deionized water is then added and mixed well. The final aqueous dispersion had a measured solids content of 30%.

A summary of the properties of Examples I-VI is shown in Table 1.

thickness of the coating near the edges in FIGS. 1-6. The via coverage represents the thickness of the coating at the bottom of a via in the substrate.

FIGS. 1-6 are schematic representations of the substrates coated with the compositions of Examples I-VI, respectively.

FIG. 1 shows a substrate 10 including a semiconductive layer 12, which in this example is silicon. The semiconductive layer defines a notch or via 14 having edges 16 and 18. A dielectric coating 20 has been deposited on the semiconductive layer using the composition of Example I. The thickness of the coating near the edges is less than or equal to 1 micron.

Figure 2:
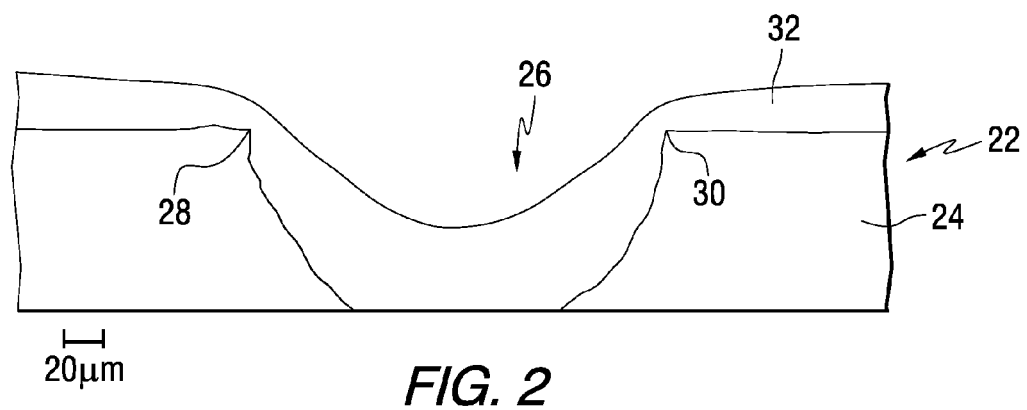

FIG. 2 shows a substrate 22 including a semiconductive layer 24, which in this example is silicon. The semiconductive layer defines a notch or via 26 having edges 28 and 30. A dielectric coating 32 has been deposited on the semiconductive layer using the composition of Example I. The thickness of the coating near the edges is about 11 micron.

Figure 3:
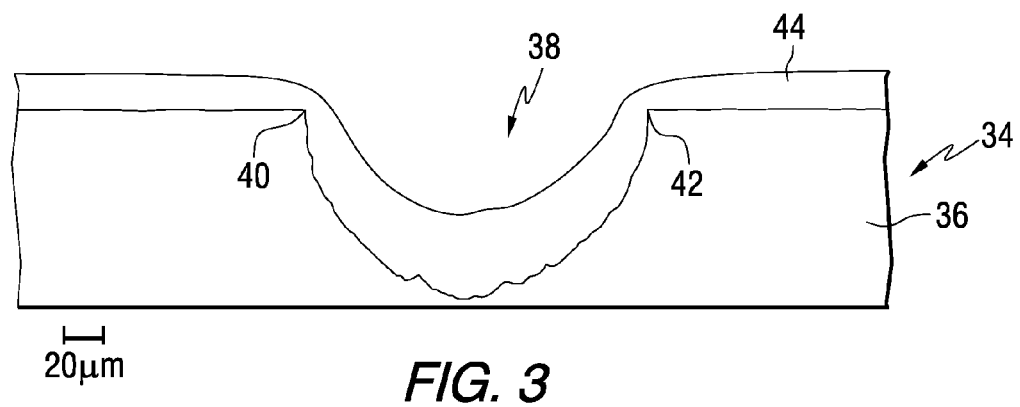

FIG. 3 shows a substrate 34 including a semiconductive layer 36, which in this example is silicon. The semiconductive layer defines a notch 38 having edges 40 and 42. A dielectric coating 44 has been deposited on the semiconductive layer using the composition of Example I. The thickness of the coating near the edges is about 10 micron.

Figure 4:
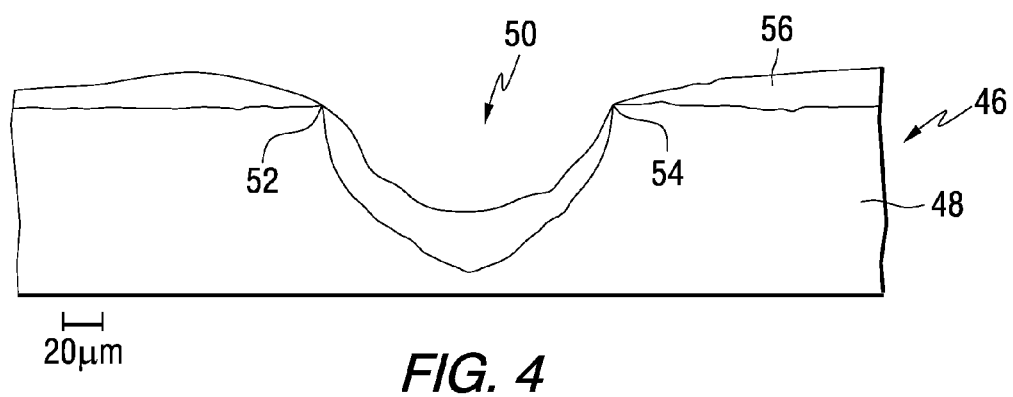

FIG. 4 shows a substrate 46 including a semiconductive layer 48, which in this example is silicon. The semiconductive

TABLE 1

| Sample | Resin Type (High or Low Bake) Formula | Total Microgel Level (Resin solids) | Standard Microgel Level (as % of Resin Solids) | Highly Crosslinked Microgel Level (as % of Resin solids) | Application Voltage | Cure Parameters | Surface Coating Thickness | Edge Coverage | Via Coverage |
|---|---|---|---|---|---|---|---|---|---|
| Example I | High Bake Resin Formula | 12.2% | 0.0% | 12.2% | 200 | 200 C./150' | 18 | <1 | 36 |
| Example II | High Bake Resin Formula | 21.8% | 0.0% | 21.8% | 200 | 200 C./150' | 27 | 11 | 45 |
| Example III | High Bake Resin Formula | 29.4% | 0.0% | 29.4% | 200 | 200 C./150' | 18-20 | 10 | 37 |
| Example IV | Low Bake Resin Formula | 9.9% | 9.9% | 0.0% | 100 | 175 C./30' | 19-23 | 0-2 | 22-26 |
| Example V | Low Bake Resin Formula | 18.9% | 8.9% | 10.0% | 100 | 175 C./30' | 17 | 3 | 20 |
| Example VI | Low Bake Resin Formula | 28.0% | 8.0% | 20.0% | 100 | 175 C./30' | 22 | 8 | 22 |

In Table 1, the High Bake Resin Blend is a cationic epoxy high molecular weight resin with polyester, as in Examples I-III, and the Low Bake Resin Blend is an epoxy urethane resin, as in Examples IV-VI. The edge coverage represents the layer defines a notch 50 having edges 52 and 54. A dielectric coating 56 has been deposited on the semiconductive layer using the composition of Example I. The thickness of the coating near the edges is less than 2 micron.

Figure 5:
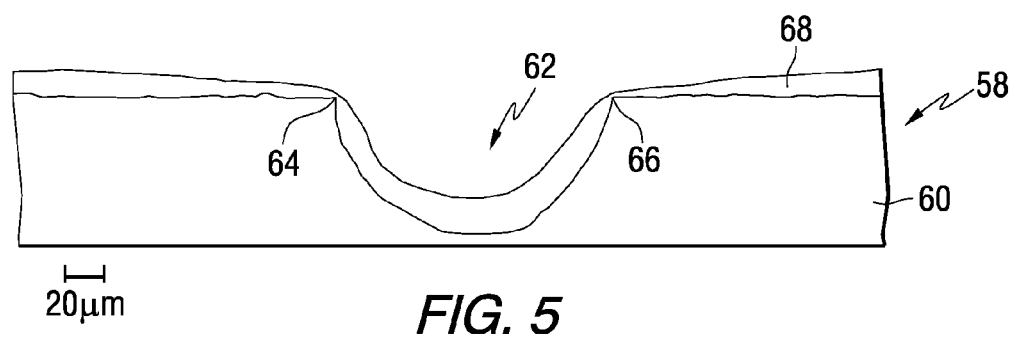

FIG. 5 shows a substrate 58 including a semiconductive layer 60, which in this example is silicon. The semiconductive layer defines a notch 62 having edges 64 and 66. A dielectric coating 68 has been deposited on the semiconductive layer using the composition of Example I. The thickness of the coating near the edges is about 3 micron.

Figure 6:
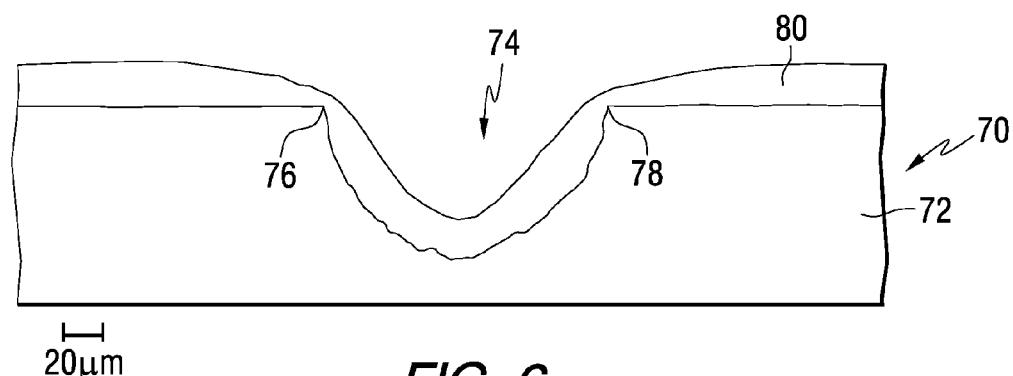

FIG. 6 shows a substrate 70 including a semiconductive layer 72, which in this example is silicon. The semiconductive layer defines a notch 74 having edges 76 and 78. A dielectric coating 80 has been deposited on the semiconductive layer using the composition of Example I. The thickness of the coating near the edges is about 8 micron.

If a minimum coating thickness is specified at, for example 5 microns, it is apparent that Examples I, IV and V do not meet the minimum specified thickness. However, Examples II, III and VI, which include a highly cross-linked microgel level of at least 20% of the resin solids, meet the specified coating thickness at the edges of the vias. In other embodiments, the minimum coating thickness can be 7 microns.

Other than in the operating examples, or where otherwise indicated, all numbers expressing quantities of ingredients, reaction conditions and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical values, however, inherently contain certain errors necessarily resulting from the standard deviation found in their respective testing measurements.

Also, it should be understood that any numerical range recited herein is intended to include all sub-ranges subsumed therein. For example, a range of "1 to 10" is intended to include all sub-ranges between and including the recited minimum value of 1 and the recited maximum value of 10, that is, having a minimum value equal to or greater than 1 and a maximum value of equal to or less than 10.

Whereas particular embodiments of this invention have been described above for purposes of illustration, it will be evident to those skilled in the art that numerous variations of the details of the present invention may be made without departure from the invention as defined in the appended claims.

We claim:

1. A method comprising:
    immersing a semiconductive substrate in an electrodeposition composition, wherein at least 20 percent by weight of resin solids in the composition is a highly cross-linked microgel component; and
    applying a voltage between the substrate and the composition to form a dielectric coating on the substrate.

2. The method of claim 1, wherein between 20 percent by weight of resin solids and 50 percent by weight of resin solids in the composition is the highly cross-linked microgel component.

3. The method of claim 1, wherein between 27 percent by weight of resin solids and 33 percent by weight of resin solids in the composition is the highly cross-linked microgel component.

4. The method of claim 1, wherein the composition further comprises a combination of a standard microgel and the highly cross-linked microgel make up between 20 percent by weight of resin solids and 50 percent by weight of resin solids in the composition.

5. The method of claim 1, wherein the composition includes a cationic epoxy high molecular weight resin, and the method further comprises:
    heating the coating to a temperature of 200° C. or less for a period of at least 150 minutes.

6. The method of claim 1, wherein the composition includes an epoxy urethane resin, and the method further comprises:
    heating the coating to a temperature of 175° C. or less for a period of at least 30 minutes.

7. The method of claim 1, wherein the substrate includes a via having a diameter of less than 250 micron.

8. The method of claim 1, wherein the substrate comprises silicon.

9. The method of claim 1, wherein the composition comprises:
    one or more active hydrogen-containing resins, wherein the active hydrogen-containing resin comprises covalently bonded halogen of greater than 20 weight percent based on total weight of resin solids present in the composition.

10. The method of claim 1, wherein the composition comprises:
    one or more polyester curing agents.

11. The method of claim 9, wherein the active hydrogen-containing resin is derived from at least one of a polyepoxide polymer and an acrylic polymer.

12. The method of claim 9, wherein the resin has a covalently bonded halogen content derived from a halogenated polyepoxide and/or a halogenated acrylic polymer.

13. The method of claim 9, wherein the covalently bonded halogen present in the resin (i) is derived from a halogenated polyhydric phenol.

14. The method of claim 13, wherein the halogenated polyhydric phenol comprises at least one of chlorinated bisphenol A and brominated bisphenol A.

15. The method of claim 13, wherein the halogenated polyhydric phenol comprises tetrabromobisphenol A.

16. The method of claim 9, wherein said active hydrogen-containing resin comprises cationic salt groups.

17. The method of claim 10, wherein said polyester comprises a polyester of a polycarboxylic acid having more than one ester group per molecule.

18. The method of claim 17, wherein said polyester is substantially free of acid.

19. The method of claim 17, wherein said polyester comprises at least one ester group per molecule in which the carbon atom adjacent to the esterified hydroxyl has a free hydroxyl group.

20. The method of claim 17, wherein the composition further includes a transesterification catalyst comprising a metal oxide, metal salt or metal complex.

21. The method of claim 20, wherein the metal oxide, metal salt and/or metal complex are derived from a metal selected from tin, bismuth and lead.

* * * * *